(12) United States Patent  
Nakamura et al.

(10) Patent No.: US 7,570,531 B2  
(45) Date of Patent: Aug. 4, 2009

(54) SEMICONDUCTOR MEMORY DEVICE AND METHOD OF CONTROLLING TIMING

(75) Inventors: Toshikazu Nakamura, Kawasaki (JP); Hiroyuki Kobayashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 128 days.

(21) Appl. No.: 11/902,703

(22) Filed: Sep. 25, 2007

(65) Prior Publication Data  
US 2008/0074943 A1   Mar. 27, 2008

(30) Foreign Application Priority Data  
Sep. 25, 2006 (JP) ............... 2006-258961

(51) Int. Cl.  
*G11C 7/02* (2006.01)

(52) U.S. Cl. .................. 365/207; 365/191; 365/210.12; 365/210.13; 365/233.1

(58) Field of Classification Search ................ 365/207, 365/191, 210.12, 210.13, 233.1  
See application file for complete search history.

(56) References Cited

U.S. PATENT DOCUMENTS

| 5,426,603 | A | 6/1995 | Nakamura et al. |
| 5,656,528 | A | 8/1997 | Wahlstrom |
| 6,366,507 | B1 | 4/2002 | Akioka et al. |
| 6,535,434 | B2 * | 3/2003 | Maayan et al. ......... 365/189.07 |
| 6,538,933 | B2 | 3/2003 | Akioka et al. |
| 6,563,757 | B2 * | 5/2003 | Agata .......................... 365/222 |
| 7,158,426 | B2 * | 1/2007 | van der Zanden et al. ... 365/201 |
| 2002/0089881 | A1 | 7/2002 | Akioka et al. |
| 2002/0186598 | A1 | 12/2002 | Ooishi |
| 2004/0141382 | A1 | 7/2004 | Ito et al. |

FOREIGN PATENT DOCUMENTS

| EP | 0 260 503 A | 3/1988 |
| JP | 2-301097 | 12/1990 |
| JP | 9-063266 | 3/1997 |
| KR | 100154718 B1 | 7/1998 |
| KR | 2001-0070098 A | 7/2001 |

\* cited by examiner

*Primary Examiner*—Pho M. Luu  
(74) *Attorney, Agent, or Firm*—Arent Fox LLP

(57) ABSTRACT

In a semiconductor memory device, in addition to a sense amplifier connected to bit lines of a memory cell array having a plurality of memory cells in a disconnectable manner, the sense amplifier performing confinement operation to disconnect the bit lines of the memory cell array and amplify a data signal during data sense operation from the memory cells, there is provided a timing adjustment circuit adjusting timing related to confinement operation in the sense amplifier, so as to allow adjusting of timing of the confinement operation and setting of timing of the confinement operation.

17 Claims, 10 Drawing Sheets

SEMICONDUCTOR MEMORY DEVICE AND METHOD OF CONTROLLING TIMING

CROSS-REFERENCE TO RELATED APPLICATIONS

This application is based upon and claims the benefit of priority from the prior Japanese Patent Application No. 2006-258961, filed on Sep. 25, 2006, the entire contents of which are incorporated herein by reference.

BACKGROUND OF THE INVENTION

1. Field of the Invention

The present invention relates to a semiconductor memory device and a method of controlling timing related to operation thereof.

2. Description of the Related Art

Miniaturization of semiconductor memory devices such as DRAM (Dynamic Random Access Memory) is in progress every year. As the miniaturization proceeds, an inter-wiring distance in a semiconductor memory device gets smaller and hence coupling capacitance increases. This increase in coupling capacitance can be a cause of malfunction due to noise.

Particularly in DRAMs, since the area of a cell decreases along with progress in miniaturization, an inter-wiring distance between bit lines connected to memory cells decreases as well. As a result, capacitance between bit lines becomes large, which increases possibility that malfunction occurs due to noise in a sense amplifier while reading out data stored in the memory cells.

As a method to avoid this problem, confinement type sense amplifier operation is known (for example, refer to Japanese Patent Application Laid-open Nos. Hei 9-63266 and Hei 2-301097). The confinement type sense amplifier operation is realized by connecting bit lines in a sense amplifier and bit lines on a memory cell side to which memory cells are connected via transfer gates, and electrically disconnecting the bit lines in the sense amplifier and the bit lines on the memory cell side for a certain period of time when reading (sensing) data from the memory cells.

Figure 10:
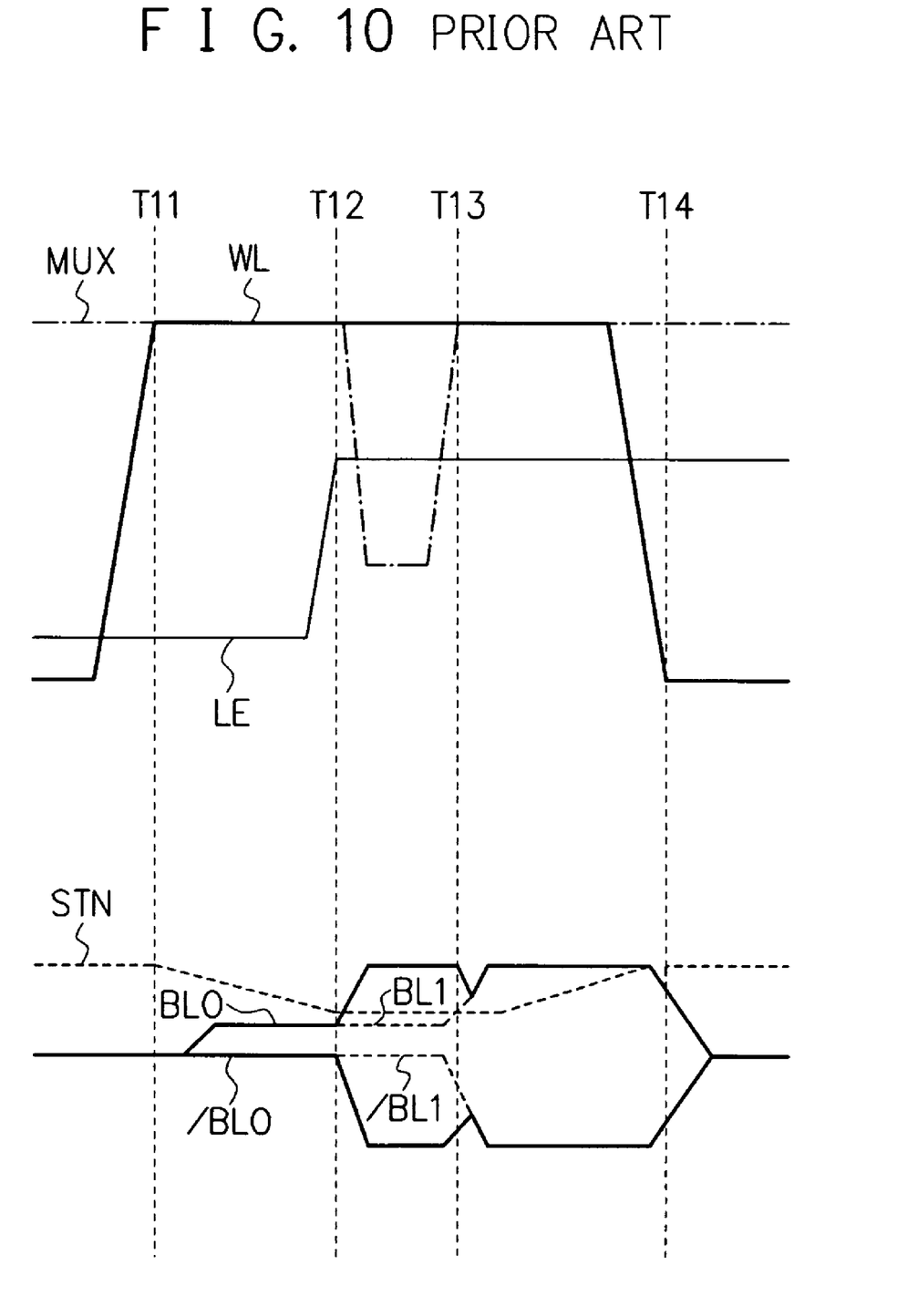
FIG. 10 is a chart showing operational waveforms of confinement type sense amplifier operation.

Specifically, as shown in FIG. 10, a word line WL is selected (time T11), and data stored in the memory cell is outputted to the bit line. At this time, a control signal MUX for the transfer gate to connect the bit line in the sense amplifier and the bit line on the memory cell side is at a high level (hereinafter shown by "H") and the transfer gate is in on state, and thereby the bit lines BL0, /BL0 in the sense amplifier and the bit lines BL1, /BL1 on the memory cell side are connected, respectively.

Thereafter, a sense amplifier activation signal LE is set to "H" so as to activate the sense amplifier (time T12). At this time, the control signal MUX for the transfer gates is changed to a low level (hereinafter shown by "L") so as to turn the transfer gates to off state, thereby disconnecting the bit lines BL0, /BL0 in the sense amplifier and the bit lines BL1, /BL1 on the memory cell side. Accordingly, only amplification of the bit lines BL0, /BL0 in the sense amplifier is performed (see times T12 and T13).

After the amplification of the bit lines BL0, /BL0 in the sense amplifier is completed, the control signal MUX for the transfer gates are turned to "H" again so as to connect the bit lines BL0, /BL0 in the sense amplifier and the bit lines BL1, /BL1 on the memory cell side (time T13). In this way, amplification results in the bit lines BL0, /BL0 in the sense amplifier are transmitted to the bit lines BL1, /BL1 on the memory cell side, thereby restoring data in the memory cell. Subsequently, the word line is turned to a non-selected state (time T14) so as to complete the operation. Note that in FIG. 10, STN is a potential level of a storage node in the memory cell (node connected to a capacitor constituting the memory cell).

By allowing the operation as described above, in the confinement type sense amplifier operation, when potentials on the bit lines are amplified by the sense amplifier, an influence of the capacitance between the bit lines on the memory cell side no longer takes effect, and thus the occurrence of malfunction due to noise can be suppressed.

However, in a semiconductor memory device which performs the conventional confinement type sense amplifier operation, the timing to start a confinement operation, namely, the timing to turn the transfer gates to off state and disconnect the bit lines in the sense amplifier and the bit lines on the memory cell side is fixed. Accordingly, there are problems such that adjustment of deviation from optimum timing generated by manufacturing variability or the like is not possible, adjustment to a severe timing in order to accelerate a defect in evaluation/testing is not possible, and so on.

SUMMARY OF THE INVENTION

An object of the present invention is to make it possible to adjust timing related to confinement operation in a semiconductor memory device.

A semiconductor memory device according to the present invention includes: a sense amplifier connected to bit lines of a memory cell array having a plurality of memory cells in a disconnectable manner, the sense amplifier performing confinement operation to disconnect the bit lines of the memory cell array and amplify a data signal during data sense operation from the memory cells; and a timing adjustment circuit adjusting timing related to confinement operation in the sense amplifier.

DETAILED DESCRIPTION OF THE PREFERRED EMBODIMENTS

Hereinafter, an embodiment of the present invention will be described based on the drawings.

As a semiconductor memory device according to the embodiment of the present invention, explanation is given below taking a DRAM having memory cells of one transistor/one capacitor type as an example.

Figure 1:
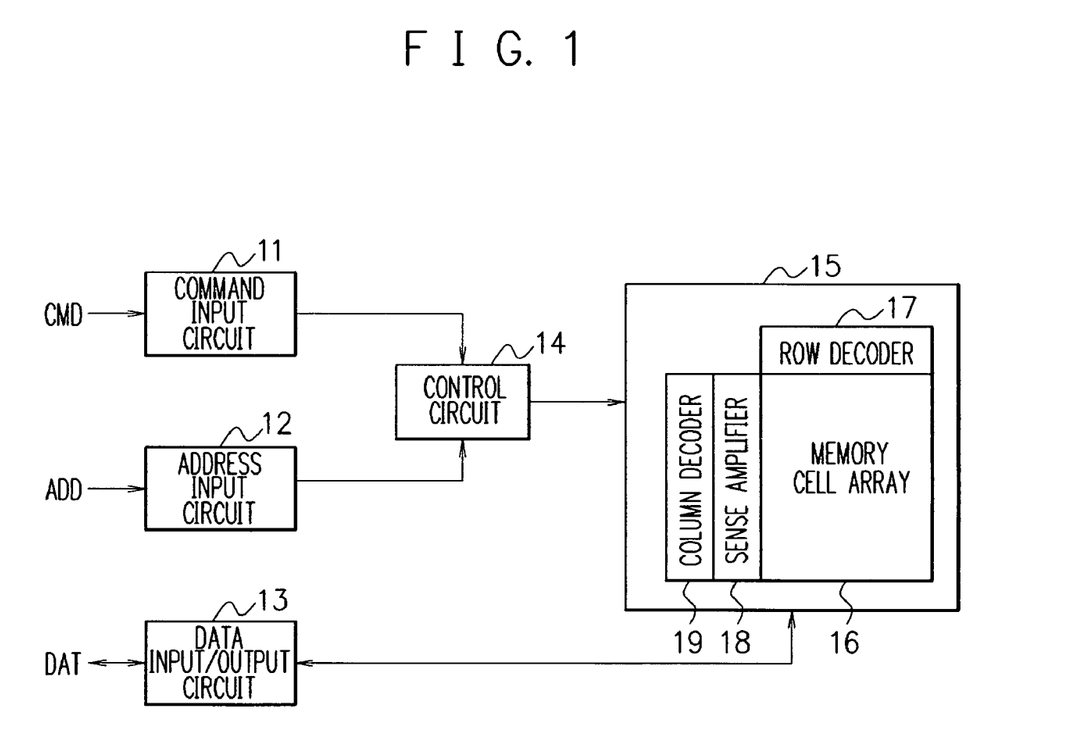
FIG. 1 is a diagram showing a configuration example of a semiconductor memory device according to an embodiment of the present invention.

FIG. 1 is a block diagram showing a configuration example of the semiconductor memory device according to the embodiment of the present invention.

As shown in FIG. 1, the semiconductor memory device according to this embodiment has a command input circuit 11, an address input circuit 12, a data input/output circuit 13, a control circuit 14, and a memory core 15.

The command input circuit 11 receives chip enable signals (/CE1, CE2), an output enable signal (/OE), and a write enable signal (/WE) as external commands CMD. The command input circuit 11 decodes a received external command CMD and outputs a decoding result as an internal command signal to the control circuit 14. As commands indicated by internal command signals, there are a read command, a write command, and so forth.

The address input circuit 12 receives an external address signal ADD via an address terminal and supplies the received external address signal ADD to the control circuit 14.

During data read operation, the data input/output circuit 13 outputs read data transferred from the memory core 15 via a data bus as a data signal DAT via an external data terminal. Further, during data write operation, the data input/output circuit 13 receives write data inputted as data signal DAT via the external data terminal and transfers the received write data to the memory core 15 via the data bus. Data input/output operation in the data input/output circuit 13 is performed based on instruction from the control circuit 14.

In response to an internal command signal (read command, write command, or the like) supplied from the command input circuit 11 and a refresh command generated inside the semiconductor memory device, the control circuit 14 generates a timing signal for performing data read operation and data write operation to the memory core 15, and supplies the generated timing signal to the memory core 15, and so forth. Further, the control circuit 14 decodes the external address signal ADD supplied from the address input circuit 12 and supplies a decode signal thereof to the memory core 15.

When a read command or a write command as the internal command conflicts with the refresh command which is generated internally, the control circuit 14 has an arbitration function to perform arbitration between these commands. Note that the refresh command is generated periodically by a not-shown refresh timer.

Figure 3:
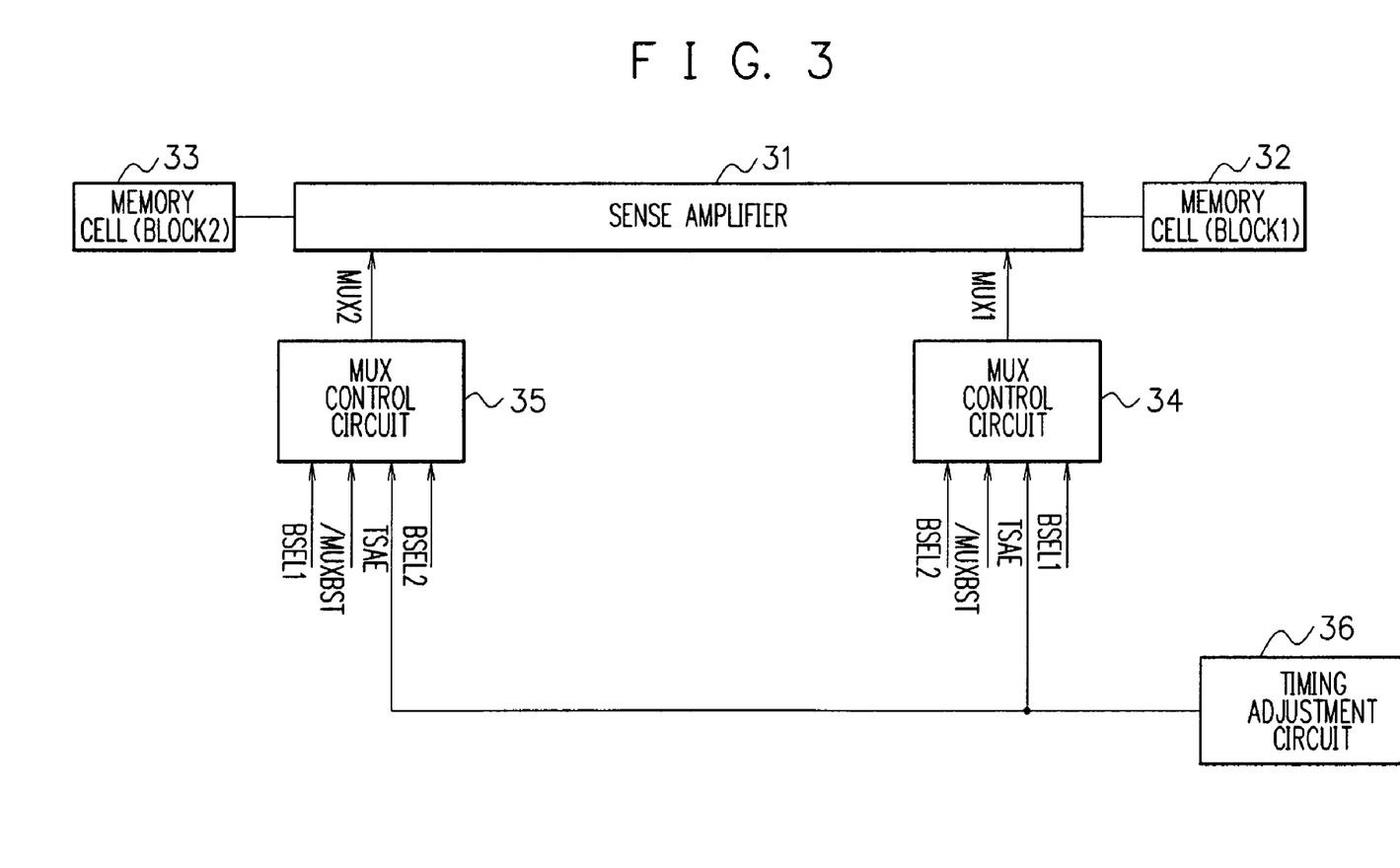
FIG. 3 is a diagram showing a circuit configuration related to timing adjustment of confinement operation in this embodiment.

The control circuit 14 has a circuit as shown in FIG. 3 for adjusting start timing of confinement operation or the like in confinement type sense amplifier operation. This circuit related to timing adjustment of the confinement operation will be described later.

The memory core 15 has a memory cell array 16, a row decoder 17, a sense amplifier 18, and a column decoder 19. The memory cell array 16 has a plurality of memory cells (dynamic memory cells) arranged in an array form, and each memory cell has one transfer transistor and one capacitor for storing data. Further, the memory cell array 16 has word lines connected respectively to gates of the transfer transistors of the memory cells and bit lines connected respectively to data input/output nodes of the transfer transistors.

The row decoder 17 selects one word line from the plurality of word lines in response to a row decode signal as a supplied decode signal.

During data read operation for example, the sense amplifier 18 amplifies potentials (data signal) of bit lines according to data read from the memory cells. At this time, the sense amplifier 18 performs confinement operation to disconnect the bit lines in the sense amplifier and the bit lines on the memory cell side and, after the amplification of the potentials of the bit lines is completed, reconnect the bit lines in the sense amplifier to the bit lines on the memory cell side, to thereby amplify the potentials of the bit lines.

In response to a column decode signal as a supplied decode signal, the column decoder 19 outputs a control signal so as to control column gates for transmitting read data amplified by the sense amplifier 18 read into the bit lines to the data bus, or transmitting write data supplied via the data bus to the bit lines.

Figure 2:
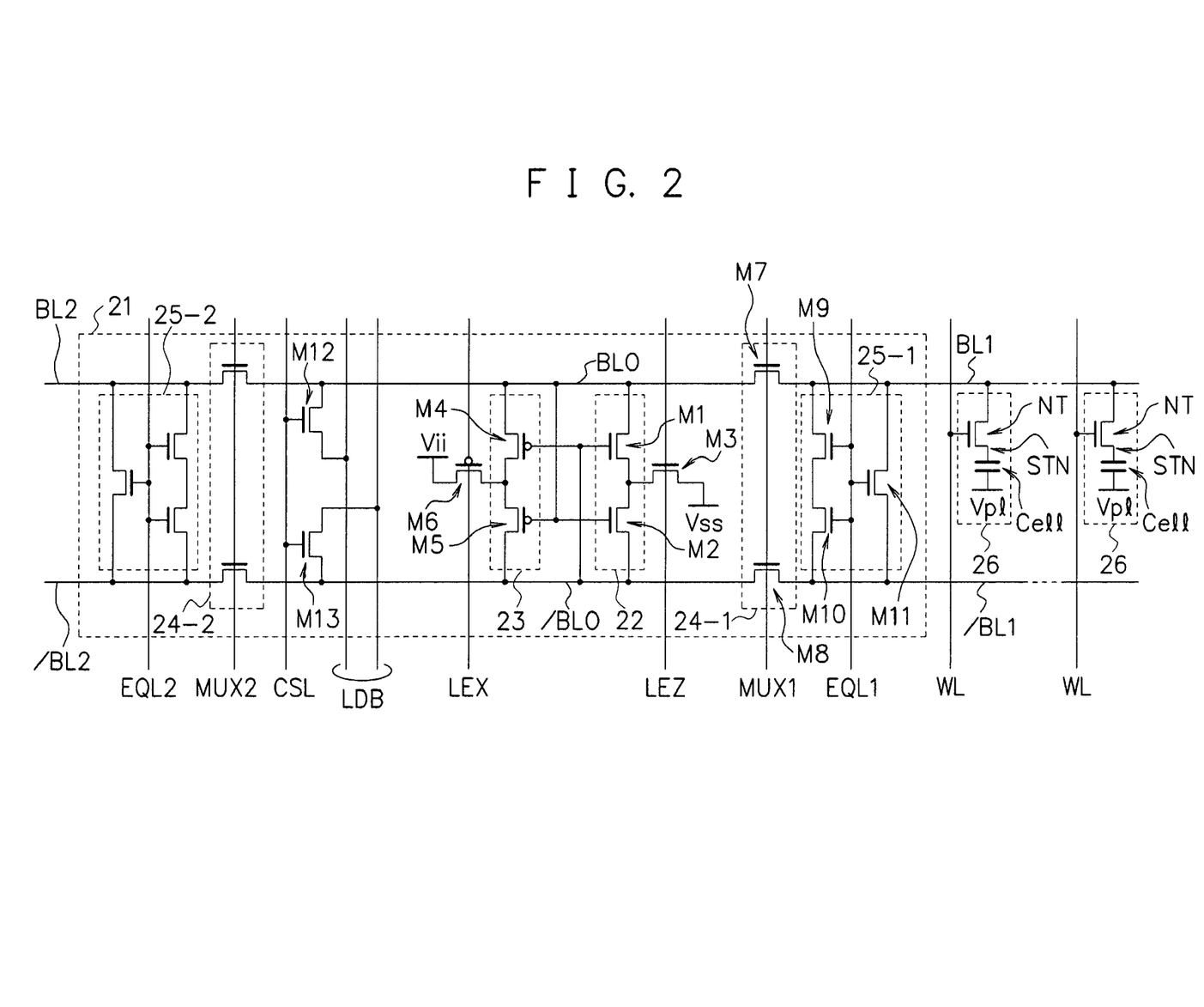
FIG. 2 is a circuit diagram showing a configuration of a sense amplifier in this embodiment.

FIG. 2 is a circuit diagram showing a configuration of a sense amplifier in this embodiment.

The sense amplifier 21 has an N-channel sense amplifier 22 for detection/amplification and a P-channel sense amplifier 23 for restoration.

The N-channel sense amplifier 22 has two N-channel MOS transistors (also referred to as NMOS transistors below) M1, M2 with respective gates and drains being cross-coupled. The NMOS transistor M1 has a drain connected to a bit line BL0 in the sense amplifier 21 and a gate connected to a bit line /BL0 in the sense amplifier 21. The NMOS transistor M2 has a drain connected to the bit line /BL0 and a gate connected to the bit line BL0. The sources of the NMOS transistors M1 and M2 are connected in common to the source of an NMOS transistor M3 having a gate supplied with a sense amplifier activation signal LEZ. The drain of the NMOS transistor M3 is connected to a reference potential Vss.

The P-channel sense amplifier 23 has two P-channel MOS transistors (also referred to as PMOS transistors below) M4, M5 with respective gates and drains being cross-coupled. The PMOS transistor M4 has a drain connected to the bit line BL0, and a gate connected to the bit line /BL0. The PMOS transistor M5 has a drain connected to the bit line /BL0 and a gate connected to the bit line BL0. The sources of the PMOS transistors M4 and M5 are connected in common to the source of a PMOS transistor M6 having a gate supplied with a sense amplifier activation signal LEX. The drain of the PMOS transistor M6 is connected to power supply voltage Vii.

The pair of bit lines BL0, /BL0 in the sense amplifier 21 are connected to a pair of bit lines BL1, /BL1 in a first memory block (memory cell side) via a gate circuit (switch circuit) 24-1 having NMOS transistors M7, M8. Specifically, the bit line BL0 in the sense amplifier 21 is connected to the bit line BL1 on the memory cell side via a transfer gate constituted by the NMOS transistor M7 having a gate supplied with a control signal MUX1. The bit line /BL0 in the sense amplifier 21 is connected to the bit line /BL1 on the memory cell side via a transfer gate constituted by the NMOS transistor M8 having a gate supplied with the control signal MUX1.

In other words, the pair of bit lines BL0, /BL0 in the sense amplifier 21 and the pair of bit lines BL1, /BL1 on the memory cell side are connected in a disconnectable manner such that whether to electrically connect or disconnect the bit lines can be switched according to the control signal MUX1. When the control signal MUX1 is at a high level ("H"), the pair of bit lines BL0, /BL0 and the pair of bit lines BL1, /BL1 are connected. When the control signal MUX1 is at a low level ("L"), the pair of bit lines BL0, /BL0 and the pair of bit lines BL1, /BL1 are disconnected.

To the pair of bit lines BL1, /BL1 in the first memory block, a precharge/equalize circuit 25-1 is connected for precharging and equalizing the pair of bit lines to a predetermined potential (for example, ½ of the power supply voltage Vii). The precharge/equalize circuit 25-1 has three NMOS transistors M9, M10, M11 each having a gate supplied with an equalize signal EQL1. The precharge/equalize circuit 25-1 precharges and equalizes the pair of bit lines to the predetermined potential by turning of the NMOS transistors M9, M10, M10 to on states according to the equalize signal EQL1.

Further, a plurality of word lines WL are arranged so as to cross the pair of bit lines BL1, /BL1 in the first memory block, and a memory cell 26 is provided at each intersection of the bit lines BL1 and /BL1 and one of the word lines WL. The memory cell 26 has an NMOS transistor NT as a transfer transistor and a cell capacitor Cell. One end of the cell capacitor Cell is connected to the bit line BL1 via the transfer transistor NT having a gate connected to the word line WL, and the other end thereof is connected to a cell plate potential Vpl. Here, the connection node of the transfer transistor NT and the one end of the cell capacitor Cell is referred to as a storage node STN in the memory cell.

A second memory block is constructed similarly to the first memory block. Specifically, a pair of bit lines BL2, /BL2 in the second memory block (memory cell side) is connected in a disconnectable manner to the pair of bit lines BL0, /BL0 in the sense amplifier 21 via a gate circuit 24-2, and a precharge/equalize circuit 25-2 is connected to the pair of bit lines BL2, /BL2 in the second memory block. Further, in the second memory block, although not shown, a plurality of word lines WL are arranged so as to cross the pair of bit liens BL2, /BL2, and a memory cell is provided at each intersection of the bit lines BL2 and /BL2 and one of the word lines WL.

Further, the bit lines BL0, /BL0 in the sense amplifier 21 are connected to local data buses LDB via column gates constituted of NMOS transistors M12, M13 each having a gate connected to a column selection line CSL. Selecting the column selection line CSL turns the column gates to on states, and potentials of the bit lines BL0, /BL0 are outputted to the local data buses LDB.

FIG. 3 is a diagram showing a circuit configuration related to timing adjustment of the confinement operation in the confinement type sense amplifier operation in this embodiment.

There are provided the first and second memory blocks 32, 33 each having a plurality of memory cells in connection with the sense amplifier 31. The bit lines (BL0, /BL0) in the sense amplifier 31 and the bit lines (BL1, /BL1) in the first memory block 32 are connected as shown in FIG. 2 via the transfer gates which are on/off-controlled by the control signal MUX1. The bit lines (BL0, /BL0) in the sense amplifier 31 and the bit lines (BL1, /BL1) on the memory cell side turn to connected states when the control signal MUX1 is "H", and turn to disconnected states when the control signal MUX1 is "L".

Similarly, the bit lines (BL0, /BL0) in the sense amplifier 31 and the bit lines (BL2, /BL2) in the second memory block 33 are connected via the transfer gates which are on/off-controlled by a control signal MUX2. The bit lines (BL0, /BL0) in the sense amplifier 31 and the bit lines (BL2, /BL2) on the memory cell side turn to connected states when the control signal MUX2 is "H", and turn to disconnected states when the control signal MUX2 is "L".

The control signal MUX1 is outputted by a first MUX control circuit 34 and the control signal MUX2 is outputted by a second MUX control circuit 35. Memory block selection signals BSEL1, BSEL2, and timing control signals TSAE, /MUXBST are inputted to the MUX control circuits 34, 35, and based on these inputted signals, the MUX control circuits 34, 35 generate and output the control signals MUX1, MUX2, respectively. The MUX control circuits 34, 35 constitute a switch control circuit according to the present invention.

Here, the memory block selection signals BSEL1, BSEL2 are "L" when not being selected, where only memory block selection signal BSEL1 turns t6 "H" when the first memory block 32 is to be selected, and only memory block selection signal BSEL2 turns to "H" when the second memory block 33 is to be selected.

The timing control signal TSAE is a signal indicating timing to turn the control signals MUX1, MUX2 from "H" to "L", namely, timing to disconnect the bit lines in the sense amplifier and the bit lines on the memory cell side (start timing of the confinement operation) in the confinement type sense amplifier operation. The timing control signal /MUXBST is a signal of negative logic and is a signal showing timing to turn the control signals MUX1, MUX2 to "H" again after the confinement operation in the sense amplifier operation. In other words, the timing control signal /MUXBST is a signal showing timing to reconnect the bit lines in the sense amplifier and the bit lines on the memory cell side.

The timing control signal TSAE is outputted from the timing adjustment circuit 36. The timing adjustment circuit 36 delays a signal psaez corresponding to an activation signal for the sense amplifier 31 by a set delay amount as will be described later, and outputs it as the timing control signal TSAE.

Figure 4:
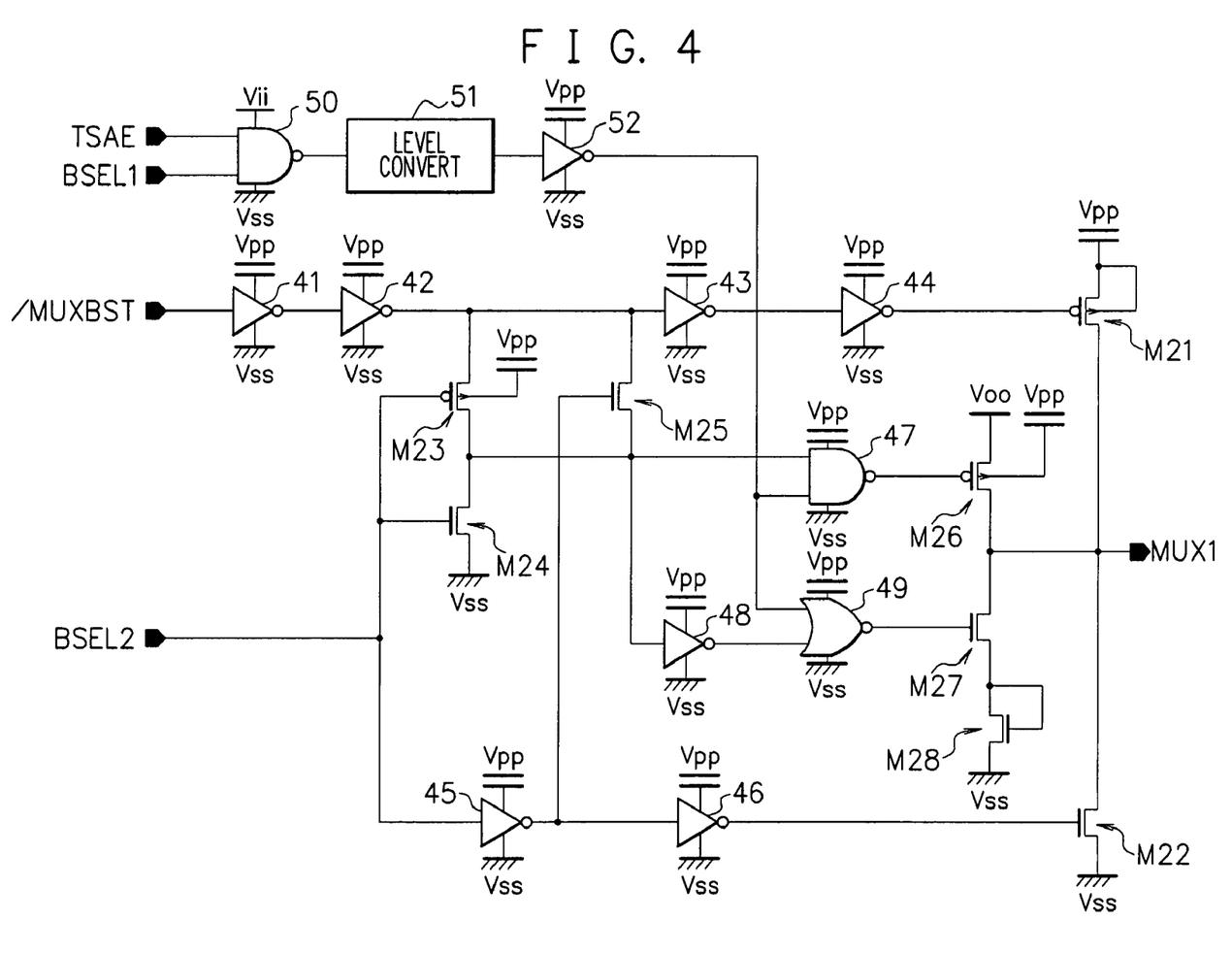
FIG. 4 is a circuit diagram showing a configuration of an MUX control circuit.

FIG. 4 is a circuit diagram showing the configuration of the MUX control circuit. FIG. 4 shows the first MUX control circuit 34 which generates and outputs the control signal MUX1 according to the first memory block 32 in FIG. 3. Note that the second MUX control circuit 35 which outputs the control signal MUX2 is constituted similarly by exchanging the memory block selection signals BSEL1, BSEL2 and changing the control signal MUX1 to the control signal MUX2.

The timing control signal /MUXBST is supplied to the gate of a PMOS transistor M21 via inverters 41, 42, 43, 44 connected in series. Note that the inverters 41, 42, 43, 44 are connected in this order from an input node for the timing control signal /MUXBST toward the gate of the PMOS transistor M21. The PMOS transistor M21 has a source supplied with power supply voltage Vpp higher than the power supply voltage Vii, and a drain connected to an output node of the control signal MUX1.

The memory block selection signal BSEL2 is supplied to the gate of an NMOS transistor M22 via inverters 45, 46. The NMOS transistor M22 has a source connected to the reference potential Vss and a drain connected to the output node of the control signal MUX1.

Further, the memory block selection signal BSEL2 is supplied to the gate of a PMOS transistor M23 and the gate of an NMOS transistor M24, and also supplied to the gate of an NMOS transistor M25 via the inverter 45. The source of the PMOS transistor M23 and the source of the NMOS transistor M25 are connected to the connection point of the output of the inverter 42 and the input of the inverter 43. The drain of the PMOS transistor M23 and the drain of the NMOS transistor M24 are connected, and the source of the NMOS transistor M24 is connected to the reference potential Vss.

The connection point of the drain of the PMOS transistor M23 and the drain of the NMOS transistor M24 as well as the drain of the NMOS transistor M25 are connected to one input end of a NAND circuit (negative AND circuit) 47, and also connected to one input end of a NOR circuit (negative OR circuit) 49 via an inverter 48.

The memory block selection signal BSEL1 and the timing control signal TSAE are inputted to a NAND circuit 50. An output of the NAND circuit 50 is supplied to the other input end of the NAND circuit 47 and the other input end of the NOR circuit 49 via a level conversion circuit 51 and an inverter 52. Here, the level conversion circuit 51 makes the potential of an outputting "H" signal be the power supply voltage Vpp, and a signal inputted thereto is inverted in logic by an internal signal transmission path and outputted.

An output of the NAND circuit 47 is supplied to the gate of a PMOS transistor M26. The PMOS transistor M26 has a source supplied with power supply voltage Voo lower than the power supply voltage Vpp, and a drain connected to the output node of the control signal MUX1.

Further, an output of the NOR circuit 49 is supplied to the gate of an NMOS transistor M27. The NMOS transistor M27 has a source connected to the reference potential Vss via a diode-connected NMOS transistor M28, and a drain connected to the output node of the control signal MUX1.

By constructing the MUX control circuit 34 as above, the PMOS transistor M21 turns to an on state only when the timing control signal /MUXBST is "L", and the NMOS transistor M22 turns to an on state only when the memory block selection signal BSEL1 is "H". Further, the PMOS transistor M26 turns to an on state when at least one of the memory block selection signal BSEL1 and the timing control signal TSAE is "L", and the memory block selection signal BSEL2 is "L", and the timing control signal /MUXBST is "H". Further, the NMOS transistor M27 turns to an on state when the memory block selection signal BSEL1 and the timing control signals TSAE, /MUXBST are "H", and the memory block selection signal BSEL2 is "L".

Therefore, when neither of the first and second memory blocks is selected, the memory block selection signals BSEL1, BSEL2 are both "L" and the timing control signal /MUXBST is "H", and hence the transistor M26 turns to an on state and the transistors M21, M22, M27 turn to off states. Therefore, the control signal MUX1 turns to "H" (voltage Voo).

Further, when the first memory block is selected, the memory block selection signal BSEL1 turns to "H", and the memory block selection signal BSEL2 turns to "L".

In this state, in data read operation for example, since the timing control signals TSAE is "L" and the timing control signal /MUXBST is "H" before the confinement operation in the sense amplifier is started, the transistor M26 turns to an on state and the transistors M21, M22, M27 turn to off states. Therefore, the control signal MUX1 turns to "H" (voltage Voo).

Then, when the timing control signal TSAE changes from "L" to "H" at timing to start the confinement operation, the transistor M27 turns to an on state, and the transistors M21, M22, M26 turn to off states. Therefore, the control signal MUX1 turns to "L".

Subsequently, when the timing control signal /MUXBST changes from "H" to "L", the transistor M21 turns to an on state, and the transistors M22, M26, M27 turn to off states. Therefore, the control signal MUX1 turns to "H" (voltage Vpp).

Figure 5:
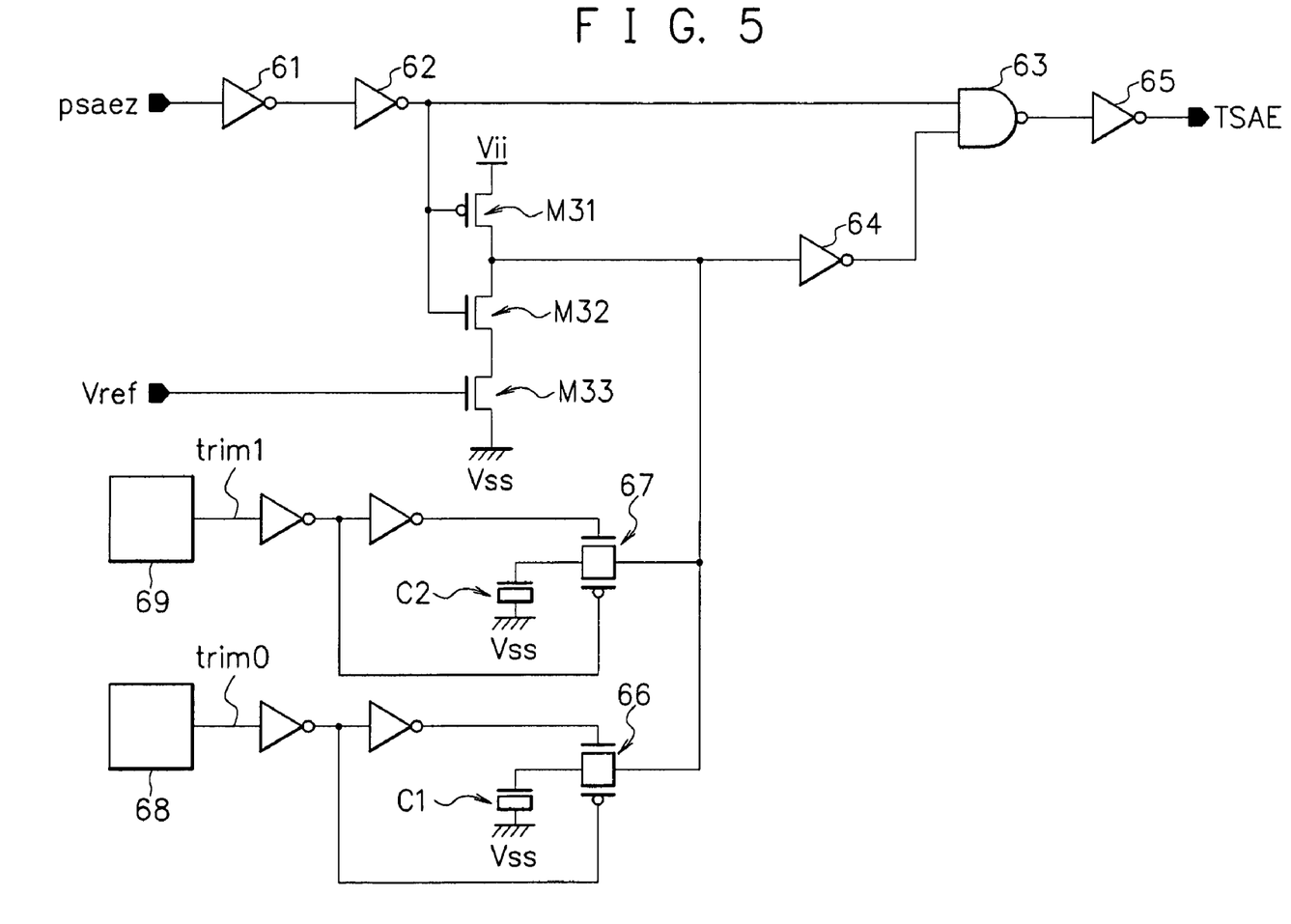
FIG. 5 is a circuit diagram showing a configuration of a timing adjustment circuit.

FIG. 5 is a circuit diagram showing a configuration of the timing adjustment circuit.

In FIG. 5, the inputted signal psaez is a signal corresponding to the sense amplifier activation signal, and is activated at the same timing as the sense amplifier activation signal. The signal psaez is supplied to one input of a NAND circuit 63 and gates of a PMOS transistor M31 and an NMOS transistor M32 via inverters 61, 62 connected in series.

The PMOS transistor M31 has a source supplied with the power supply voltage Vii, and a drain connected to the drain of the NMOS transistor M32. The NMOS transistor M32 has a source connected to the drain of an NMOS transistor M33. The NMOS transistor M33 has a source connected to the reference potential Vss, and a gate supplied with a signal Vref having a predetermined potential, thereby functioning as a constant current source.

The connection point of the drain of the PMOS transistor M31 and the drain of the NMOS transistor M32 are connected to the other input of the NAND circuit 63 via an inverter 64. An output end of the NAND circuit 63 is connected to an output node of the timing control signal TSAE via an inverter 65. In other words, an output of the NAND circuit 63 is inverted and outputted as the timing control signal TSAE.

Here, to the input node of the inverter 64, capacitances C1, C2 each constituted of an NMOS transistor are connected via transfer gates 66, 67 each constituted of a pair of NMOS transistor and PMOS transistor. Here, capacitance values of the capacitance C1 and the capacitance C2 may be the same, but are preferred to be different for increasing variations of a delay amount which will be described later.

The transfer gates 66, 67 are controlled by trimming signals trim0, trim1 outputted by programmable elements 68, 69. The programmable elements 68, 69 are each constituted of a fuse circuit or the like. When the fuse circuit is used, the trimming signals trim0, trim 1 can be controlled by selecting and cutting a fuse, or the like.

With the timing adjustment circuit constructed as above, the NMOS transistor M33 is made to function as a constant current source by supplying the signal Vref having a predetermined potential to the gate thereof, and the transfer gates 66, 67 are on/off-controlled by the trimming signals trim0, trim1 outputted according to setting, thereby increasing/decreasing the capacitance at the input node of the inverter 64. Using a delay circuit employing such a constant current source, a delay amount until the timing control signal TSAE changes can be controlled relative to the change of the signal psaez, thereby enabling adjustment of timing to start the confinement operation in the sense amplifier.

Next, operation of the semiconductor memory device according to this embodiment will be described. In the following, only read operation in the semiconductor memory device according to this embodiment is explained.

Figure 6:
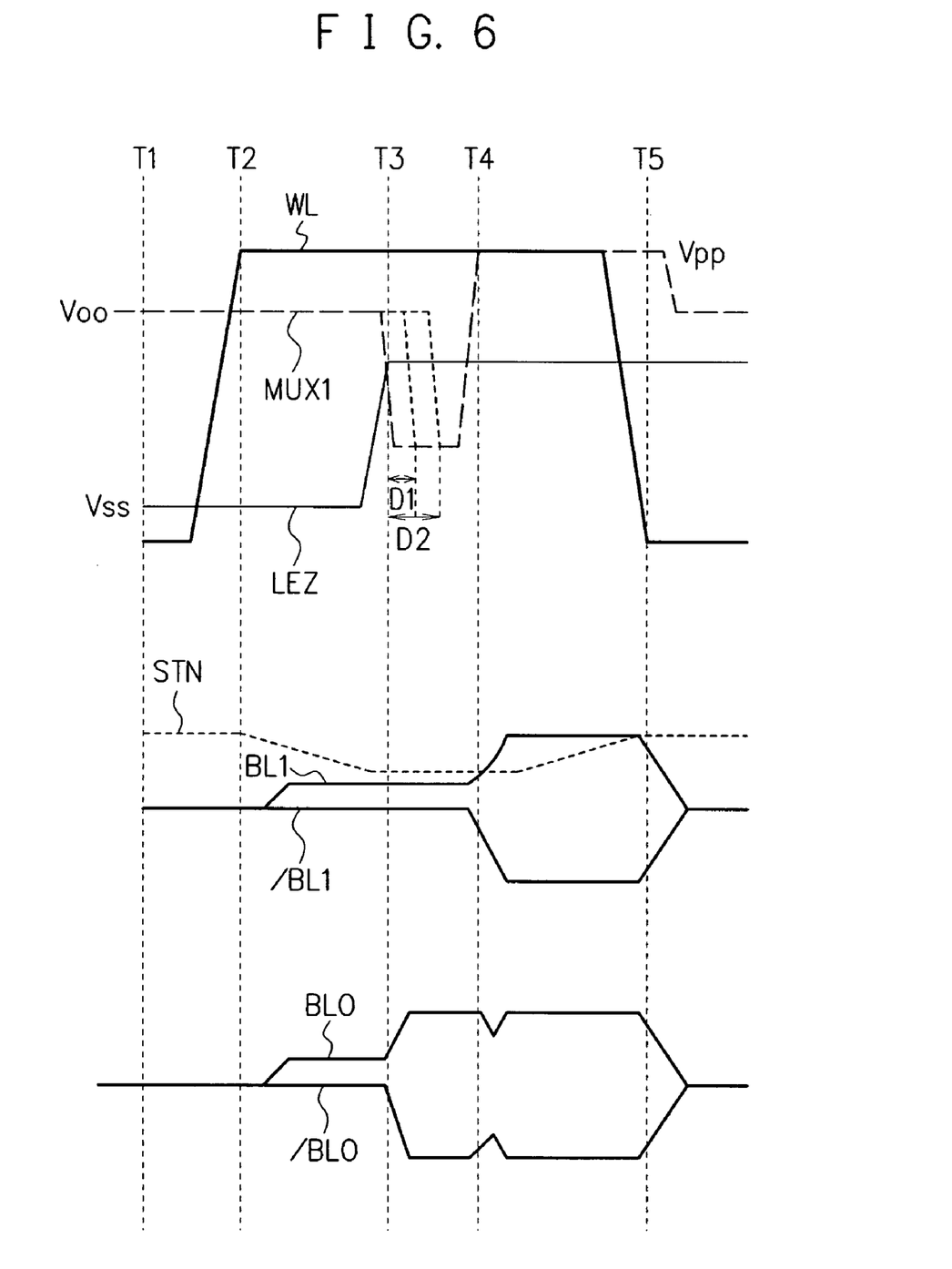
FIG. 6 is a chart showing operational waveforms of confinement type sense amplifier operation in this embodiment.

FIG. 6 is a chart showing operational waveforms of the semiconductor memory device of this embodiment. In FIG. 6, operational waveforms according to the confinement type sense amplifier operation in read operation to the first memory block is shown as an example.

First, before starting the read operation (data sense operation) to the first memory block (for example, time T1), the memory block selection signals BSEL1, BSEL2, and the timing control signal TSAE are "L", and the timing control signal /MUXBST is "H", and hence the control signal MUX1 maintains "H" (voltage Voo). The word lines WL in the memory cell array are in non-selected states, and the sense amplifier activation signal LEZ is in an inactive state. Therefore, the bit lines BL0, /BL0 in the sense amplifier and the bit lines BL1, /BL1 on the memory cell side are connected, and are also precharged and equalized to a predetermined potential by the precharge/equalize circuit. Note that the control signal MUX2, which is not shown, also maintains "H" (voltage Voo).

Then, when the read operation to the first memory block is started, one of the word lines WL is selected due to change of the memory block selection signal BSEL1 to "H" (time T2), and data stored in a related memory cell is outputted to the bit lines. At this time, since the memory block selection signal BSEL1 and the timing control signal /MUXBST are "H", and the memory block selection signal BSEL2 is "L", the control signal MUX1 maintains "H" (voltage Voo). Therefore, the transfer gates in the gate circuit connecting the bit lines BL0, /BL0 in the sense amplifier and the bit lines BL1, /BL1 on the memory cell side are in on states, and the bit lines BL0, /BL0 in the sense amplifier and the bit lines BL1, /BL1 on the memory cell side are connected.

On the other hand, although not shown, the control signal MUX2 turns to "L" (voltage Vss) and is maintained during a period in which the memory block selection signal BSEL1 is "H". Therefore, the transfer gates in the gate circuit connecting the bit lines BL0, /BL0 in the sense amplifier and the bit lines BL2, /BL2 on the memory cell side turn to off states, and the bit lines BL0, /BL0 in the sense amplifier and the bit lines BL2, /BL2 on the memory cell side are disconnected.

Thereafter, when the sense amplifier activation signal LEZ is turned to "H" so as to activate the sense amplifier (time T3), the signal psaez corresponding to the sense amplifier activation signal LEZ is also activated. Accordingly, being delayed by the timing adjustment circuit 36 by a delay amount adjusted by the trimming signals trim0, trim1 according to setting, the timing control signal TSAE is turned to "H". Due to the change of the timing control signal TSAE from "L" to "H", the control signal MUX1 turns to "L". In other words, when the set delay amount (according to a capacitance to be added to the input node of the inverter 64 shown in FIG. 5) is elapsed (FIG. 6 shows a case of delay amounts 0, D1, D2) after turning the sense amplifier activation signal LEZ to "H", the control signal MUX1 turns to "L".

Therefore, the transfer gates in the gate circuits which connect the bit lines BL0, /BL0 in the sense amplifier and the bit lines BL1, /BL1 on the memory cell side turn to off states, and the bit lines BL0, /BL0 in the sense amplifier and the bit lines BL1, /BL1 on the memory cell side are disconnected. Then, amplification of only the bit lines BL0, /BL0 in the sense amplifier is performed.

Then, after the amplification of the bit lines BL0, /BL0 in the sense amplifier is completed, the timing control signal /MUXBST is turned to "L" so as to turn the control signal MUX1 to "H" again (voltage Vpp), thereby connecting the bit lines BL0, /BL0 in the sense amplifier and the bit lines BL1, /BL1 on the memory cell side (time T4). In this way, amplification results in the bit lines BL0, /BL0 in the sense amplifier are transmitted to the bit lines BL1, /BL1 on the memory cell side, thereby restoring the storage node STN in the memory cell.

Subsequently, the word line is turned to a non-selected state (time T5), and the operation is completed. At this time, the memory block selection signals BSEL1, BSEL2, and the timing control signal TSAE turn to "L", and the timing control signal /MUXBST turns to "H". Therefore, the control signals MUX1, MUX2 both turn to "H" (voltage Voo).

Figure 7:
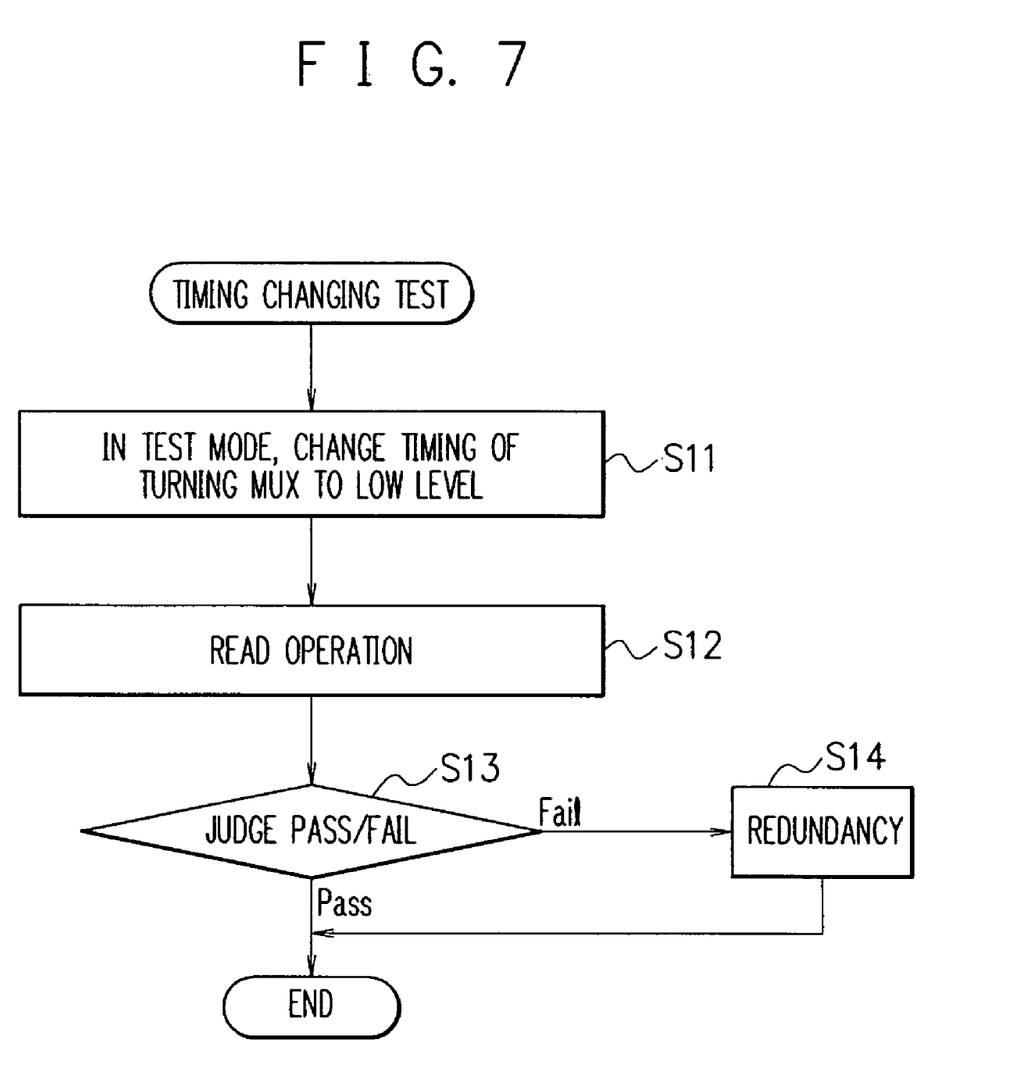
FIG. 7 is a chart showing an example of a test flow on the semiconductor memory device in this embodiment.

FIG. 7 is a chart showing an example of a test flow on the semiconductor memory device in this embodiment.

When a timing changing test is performed using delay adjustment by the timing adjustment circuit 36 in a test process on the semiconductor memory device, a testing apparatus is used to make an entry into a test mode so as to change timing related to the confinement operation in read operation to timing different from normally used timing (S11). This change of timing is realized by the above-described trimming signals trim0, trim1. Specifically, in the timing test, the programmable elements 68, 69 may be set so that the trimming signals trim0, trim1 adjusted to desired timing to be changed are outputted. Further, the entry into the test mode may be performed by an external command CMD, or a mode terminal or the like for transition to the test mode may be provided and used in the semiconductor memory device.

After the timing related to the confinement operation is changed, actual read operation is performed in the semiconductor memory device (S12). Then, based on a read result, the testing apparatus judges pass/fail at the changed timing (S13). When the result of judgment is "pass", the test is completed, and when it is "fail", redundancy is given to relieve this sense amplifier (S14).

As above, according to this embodiment, by providing the timing adjustment circuit 36 so as to allow adjustment of timing of the confinement operation in the confinement type sense amplifier operation, the timing of the confinement operation can be set to severe timing which accelerates a defect in evaluation/testing. Therefore, in addition to obviously defective items, it is possible to detect a product which can be defective in the evaluation/testing, thereby allowing prevention of such a low quality product from being shipped. Further, it is possible to adjust the timing of the confinement operation to optimum timing in which manufacturing variability and the like are taken into account, thereby improving yields thereof.

Note that the configuration of the timing adjustment circuit 36 shown in FIG. 5 is an example, and the present invention is not limited thereto. For example, the timing adjustment circuit 36 may be constructed using a delay circuit employing CR (capacitor-resistor) elements as shown in FIG. 8 and FIG. 9.

Figure 8:
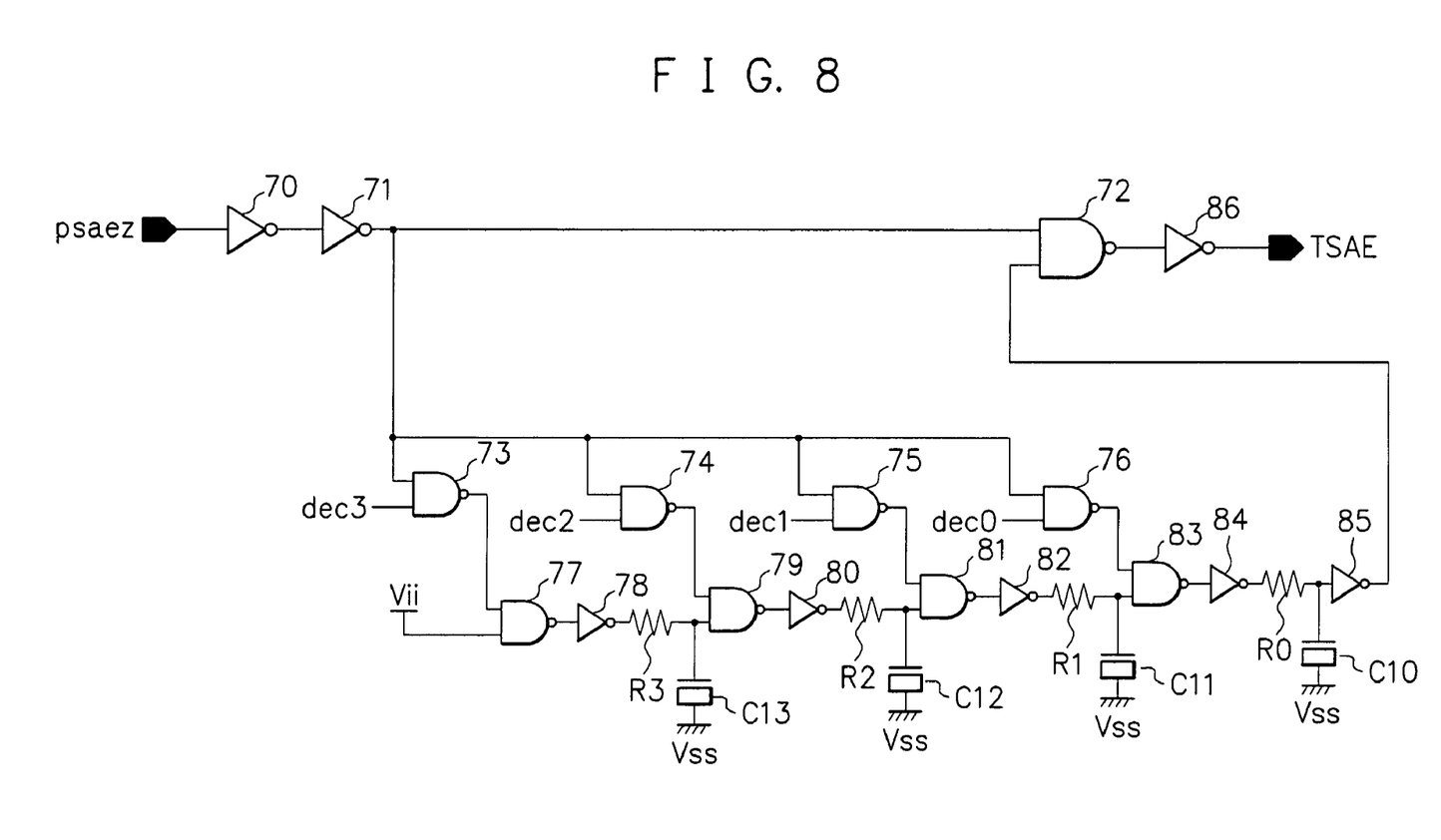
FIG. 8 is a circuit diagram showing another configuration of the timing adjustment circuit.
Figure 9:
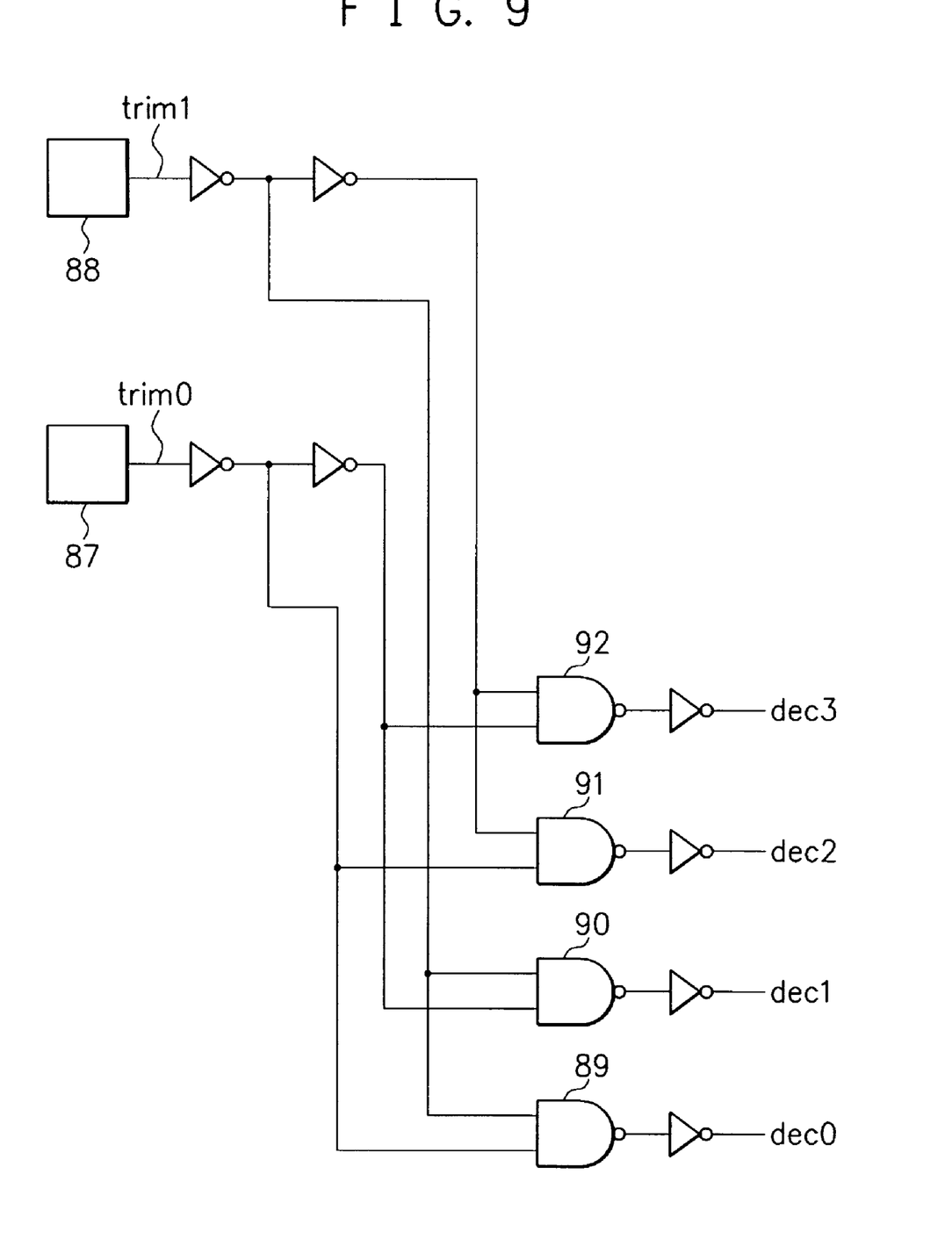
FIG. 9 is a circuit diagram showing a configuration of a decode signal generation circuit.

FIG. 8 is a circuit diagram showing another configuration of the timing adjustment circuit.

In FIG. 8, an inputted signal psaez is the same as the signal psaez shown in FIG. 5, and is supplied to one input ends of a NAND circuit 72 via inverters 70, 71 connected in series. Further, the signal psaez is supplied to one input ends of NAND circuits 73, 74, 75, 76 via the inverters 70, 71 connected in series. To the other input ends of the NAND circuits 73, 74, 75, 76, decode signals dec3, dec2, dec1, dec0 are supplied respectively.

A NAND circuit 77 is supplied with power supply voltage Vii at its one input end, and supplied with an output of the NAND circuit 73 at its other input end. An output of the NAND circuit 77 is supplied to one input end of a NAND circuit 79 via an inverter 78 and resistor R3. The NAND circuit 79 is supplied with an output of the NAND circuit 74 at its other input end, and an output thereof is supplied to one input end of a NAND circuit 81 via an inverter 80 and a resistor R2.

Similarly, the NAND circuit 81 is supplied with an output of the NAND circuit 75 at its other input end, and an output thereof is supplied to one input end of a NAND circuit 83 via an inverter 82 and a resistor R1. The NAND circuit 83 is supplied with an output of the NAND circuit 76 at its other input end, and an output thereof is supplied to the other input end of the NAND circuit 72 via an inverter 84, a resistor R0, and an inverter 85. An output end of the NAND circuit 72 is connected to an output node of the timing control signal TSAE via an inverter 86. In other words, an output of the NAND circuit 72 is inverted and outputted as the timing control signal TSAE.

Here, capacitances C13, C12, C11, C10 constituted of NMOS transistors are connected respectively to the aforementioned one input ends of the NAND circuits 79, 81, 83, and an input end of the inverter circuit 85.

Further, the decode signals dec3, dec2, dec1, dec0 are generated by the decode signal generation circuit shown in FIG. 9.

Respective inverted signals of the trimming signals trim0, trim1 outputted by programmable elements 87, 88 are inputted to a NAND circuit 89, and an output of the NAND circuit 89 is outputted as the decode signal dec0 via an inverter. A signal having the same polarity as the trimming signal trim0 and an inverted signal of the trimming signal trim1 are inputted to a NAND circuit 90, and an output of the NAND circuit 90 is outputted as the decode signal dec1 via an inverter. Further, an inverted signal of the trimming signal trim0 and a signal having the same polarity as the trimming signal trim1 are inputted to a NAND circuit 91, and an output of the NAND circuit 91 is outputted as the decode signal dec2 via an inverter. Similarly, signals having the same polarity as the trimming signals trim0, trim1 are inputted to a NAND circuit 92, and an output of the NAND circuit 92 is outputted as the decode signal dec3 via an inverter.

Specifically, the decode signal generation circuit shown in FIG. 9 decodes the trimming signals trim0, trim1 outputted by the programmable elements 87, 88 and turns one of the decode signals dec3, dec2, dec1, dec0 to "H". Here, the programmable elements 87, 88 are each constituted of a fuse circuit or the like. When the fuse circuit is used, the trimming signals trim0, trim 1 can be controlled by selecting and cutting a fuse.

By constructing the timing adjustment circuit 36 as shown in FIG. 8 and FIG. 9, effects similar to the above-described embodiment can be obtained. In the timing adjustment circuit 36 as shown in FIG. 8, when the decode signal dec3 is "H", in other words the trimming signals trim0, trim1 are both "H", the start timing of the confinement operation becomes the latest, and when the decode signal dec0 is "H", in other words the trimming signals trim0, trim1 are both "L", the start timing of the confinement operation becomes the earliest.

Further, in the above-described embodiment, the explanation taking the DRAM as an example is given, but the present invention is not limited to this. The present invention may also be applied to a semiconductor memory device which performs restore operation of writing data to a memory cell from which the data is read during data read operation.

According to the present invention, by providing the timing adjustment circuit to allow adjusting of timing of confinement operation, the timing of confinement operation can be set to severe timing or optimum timing, and thus it is possible to detect a product which can be defective by accelerating a defect during evaluation/testing and to improve yields thereof.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor memory device, comprising:
a memory cell array having a plurality of bit lines, a plurality of word lines arranged so as to cross the bit lines, and a plurality of memory cells arranged at respective intersections of the bit lines and the word lines;
a sense amplifier connected to the bit lines of said memory cell array in a disconnectable manner, said sense amplifier performing confinement operation to disconnect the bit lines of said memory cell array and amplify a data signal during data sense operation from the memory cells; and
a timing adjustment circuit adjusting timing related to the confinement operation in said sense amplifier.

2. The semiconductor memory device according to claim 1, wherein after amplification of a signal in the confinement operation is completed during the data sense operation, said sense amplifier is reconnected to the bit lines of said memory cell array.

3. The semiconductor memory device according to claim 1, wherein said timing adjustment circuit adjusts timing to start the confinement operation.

4. The semiconductor memory device according to claim 3, wherein said timing adjustment circuit delays a control signal corresponding to an activation signal of said sense amplifier and outputs the control signal so as to instruct the timing to start the confinement operation.

5. The semiconductor memory device according to claim 4, wherein said timing adjustment circuit includes a delay circuit using a constant current source which delays the control signal.

6. The semiconductor memory device according to claim 4, wherein said timing adjustment circuit includes a delay circuit using a capacitor-resistor element which delays the control signal.

7. The semiconductor memory device according to claim 4, wherein said timing adjustment circuit is capable of changing a delay amount related to the control signal according to a set value.

8. A semiconductor memory device, comprising:
a memory cell array having a plurality of bit lines, a plurality of word lines arranged so as to cross the bit lines, and a plurality of memory cells arranged at respective intersections of the bit lines and the word lines;
a sense amplifier performing confinement operation to disconnect the bit lines of said memory cell array and amplify a data signal during data sense operation from the memory cells;
a timing adjustment circuit adjusting timing related to the confinement operation in said sense amplifier;
a switch circuit connecting the bit lines of said memory cell array and bit lines of said sense amplifier; and
a switch control circuit controlling opening/closing of said switch circuit based on a timing control signal from said timing adjustment circuit.

9. The semiconductor memory device according to claim 8, wherein said timing adjustment circuit adjusts timing to start the confinement operation.

10. The semiconductor memory device according to claim 9, wherein said timing adjustment circuit delays a control signal corresponding to an activation signal of said sense amplifier by a delay circuit and outputs the control signal as a timing control signal.

11. The semiconductor memory device according to claim 10, wherein said delay circuit is a delay circuit using a constant current source.

12. The semiconductor memory device according to claim 10, wherein said delay circuit is a delay circuit using a capacitor-resistor element.

13. The semiconductor memory device according to claim 8, wherein said timing adjustment circuit uses a programmable element to adjust the timing related to the confinement operation.

14. The semiconductor memory device according to claim 9,
wherein said timing adjustment circuit has a fuse circuit, and changes timing to start the confinement operation according to whether a fuse in said fuse circuit is cut off or not.

15. The semiconductor memory device according to claim 8,
wherein adjustment of the timing related to the confinement operation by said timing adjustment circuit can be performed in a test condition in which said semiconductor memory device is different from a normal operation state.

16. A method of controlling timing in a semiconductor memory device, the semiconductor memory device having a sense amplifier connected to bit lines of a memory cell array having a plurality of memory cells in a disconnectable manner, the sense amplifier performing confinement operation to disconnect the bit lines of the memory cell array and amplify a data signal during data sense operation from the memory cells, and a timing adjustment circuit adjusting timing related to the confinement operation, the method comprising, when performing a test on the semiconductor memory device:
a timing changing step of changing the timing related to the confinement operation to timing different from normally used timing; and
a judging step of performing data sense operation at timing changed in said timing changing step and performing defective/non-defective judgment on the sense amplifier based on a sense result.

17. The method of controlling timing according to claim 16, further comprising:
a redundancy relieving step of giving redundancy to a sense amplifier which is judged as defective in said judging step.

* * * * *